United States Patent [19]

Curtin et al.

[11] Patent Number: 4,798,976
[45] Date of Patent: Jan. 17, 1989

[54] LOGIC REDUNDANCY CIRCUIT SCHEME

[75] Inventors: James J. Curtin, Fishkill; Jack A. Dorler, Holmes; George J. Jordy, Wappingers Falls; Kenneth L. Leiner, Hopewell Junction, all of N.Y.

[73] Assignee: International Business Machines Corporation, Armonk, N.Y.

[21] Appl. No.: 120,431

[22] Filed: Nov. 13, 1987

[51] Int. Cl.[4] .......................................... H03K 19/003
[52] U.S. Cl. ................................. 307/441; 307/443; 307/455; 307/465; 307/219
[58] Field of Search ....................... 307/441–443, 307/200 A, 455, 465, 475, 467, 219, 296 R, 296 A; 371/8; 377/64

[56] References Cited

U.S. PATENT DOCUMENTS

| | | | |
|---|---|---|---|
| 3,566,367 | 2/1971 | Gardner et al. | 340/172.5 |
| 3,665,173 | 5/1972 | Bouricius | 235/153 |
| 3,665,418 | 5/1972 | Bouricius | 340/172.5 |
| 3,670,148 | 6/1972 | Moses | 307/441 X |
| 3,750,173 | 5/1972 | Kemerer | 340/173 |
| 3,751,685 | 8/1973 | Jaeger | 307/219 |
| 3,800,164 | 3/1974 | Miller | 307/219 X |
| 3,805,039 | 4/1974 | Stiffler | 235/153 |
| 3,818,243 | 6/1974 | McMahon | 307/441 |
| 3,961,270 | 6/1976 | Ullmann et al. | 328/75 |
| 4,493,055 | 1/1975 | Osman | 377/64 X |
| 4,606,013 | 8/1986 | Yoshimoto | 365/200 |
| 4,621,201 | 11/1986 | Amdahl et al. | 307/219 |
| 4,689,654 | 8/1987 | Brockmann | 307/465 X |
| 4,691,123 | 9/1987 | Hashimoto | 307/296 R |
| 4,700,187 | 10/1987 | Furtek | 307/219 X |
| 4,709,166 | 11/1987 | Banker et al. | 307/219 X |

OTHER PUBLICATIONS

Bond, IBM TDB vol. 15, No. 4, 1972, pp. (1145–1146.
Jessep, Jr., IBM TDB vol. 11, No. 10, Mar. 1969, pp. (1227–1228.
"Yield and Reliability Enhancement Via Redundancy for VLSI Chips and Wafers", *IBM T.D.B.*, vol. 28, No. 1, Jun. 1985, pp. 36–42.
Mano et al., "A Redundancy Circuit for a Fault-Tolerant 256K MOSRAM", *IEEE JSSC*, vol. SC-17, No. 4, Aug. 1982, pp. 726–730.

Primary Examiner—David Hudspeth
Attorney, Agent, or Firm—William T. Ellis

[57] ABSTRACT

A logic redundancy circuit scheme, comprising a plurality of pairs of logic circuit groups, each logic circuit group in a given pair having a respective logic node and a respective power control line, with each logic circuit group in a given pair generating substantially the same logic function signal on its respective logic node as the other logic circuit group in the given pair generates on its respective logic node. The circuit scheme further includes a plurality of isolation circuits having respective output nodes, with a different isolation circuit connected to each different logic circuit group logic node. These isolation circuits are powered at all times and each operates to provide an output signal on its output node indicative of the signal on the logic node connected thereto, while isolating the connected logic node from nets connected to the isolation circuit output node. The circuit scheme also includes means for electrically connecting together for bidirectional communication the logic nodes for each pair of logic circuit groups, prior to the connection to the isolation circuit associated therewith, and switching means connected to each of the power control lines associated with the plurality of pairs of logic circuit groups for providing power to one and only one logic circuit group in each pair of logic circuit groups. The circuit scheme also includes means for controlling, through the electrically connecting means, the logic state at the isolation circuit output node of the logic circuit group in a given pair of logic circuit groups, which is not powered, to have the same logic state as the isolation circuit output node of the logic circuit group in the given pair of logic circuit groups which is powered by the switching means, so that both isolation circuit output nodes in the pair provide a correct logic signal.

17 Claims, 2 Drawing Sheets

LOGIC REDUNDANCY CIRCUIT SCHEME

BACKGROUND OF THE INVENTION

The present invention relates generally to computer logic and control circuit schemes, and more particularly to a logic control redundancy scheme for use on a single semiconductor chip.

Defects inherent in semiconductor wafers and defects added during fabrication substantially limit the size and manufacturing yield for a given semiconductor chip product. In order to improve manufacturing yield in the presence of such chip defects, various redundancy schemes have been utilized in the art. These redundancy schemes are configured to substitute "good" circuits on the chip in place of defect-ridden circuits when configuring a given logic or control finction on the chip. Such redundancy schemes are especially useful for reconfiguring random logic chips which could not otherwise be economically manufactured in large ship sizes with the necessary manufacturing yield.

However, there still remain a variety of defects which can "kill" an entire chip even when redundancy is used. For example, shorts in external nets can operate to short-out all circuits connected to that defective external net. (In this context, and external net is intended to refer to the signal line or lines that runs from one circuit group to another circuit group in the chip.) Moreover, some schemes permit the propagation of faulty signals, even after the faulty circuit has been removed from the main signal logic path.

Additionally, many redundancy schemes have a severe power consumption problem, as well as a substantial circuit overhead. For example, a number of redundancy schemes use complex voter control circuits to determine which circuits are functional. Such circuits not only require many circuit elements for their implementation, but also add substantial delay to the overall circuit operation.

The invention as claimed is intended to remedy the above-described problems of the prior art.

One advantage offered by the present invention is that external net shorts can no longer "kill" the entire chip. Additionally, the present invention prevents faulty signals from a defective circuit from propagating, and ensures that, in most cases, there are two "good" signals present on parallel redundant channels. Moreover, the foregoing advantages are achieved with a significant reduction of chip power consumption, circuit complexity and delay relative to normal redundancy schemes.

SUMMARY OF THE INVENTION

Briefly, the present invention is a redundancy circuit scheme, comprising a plurality of pairs of circuit groups, each circuit group in a given pair having a respective circuit node and a respective power control line, each circuit group in a given pair for generating substantially the same electrical signal on its respective circuit node as the other circuit group in the given pair generates on its respective node;

a plurality of isolation circuits having respective output nodes, with a different isolation circuit connected to a circuit node for each different circuit group, with the isolation circuits being powered at all times during operation, and with each of the isolation circuits for providing an output signal on its output node indicative of the signal on the circuit node connected thereto, while isolating the connected circuit node from nets connected to the isolation circuit output node;

means for electrically connecting together, for bidirectional communication, the circuit nodes for each pair of circuit groups, prior to the connection to the isolation circuit associated therewith;

switching means connected to each of the power control lines associated with the plurality of pairs of circuit groups for providing power to one and only one circuit group in each pair of circuit groups; and means for controlling, through the electrically connecting means, the electrical state at the isolation circuit output node of the circuit group in a given pair of circuit groups which is not powered by the switching means, to have the same electrical state as the isolation circuit output node of the circuit group in the given pair of circuit groups which is powered by the switching means, so that both isolation circuit output nodes in the pair provide a correct electrical signal.

In one embodiment of the present invention, the controlling means comprises, for each pair of circuit groups, an output stage in each circuit group which, when its circuit group is powered on, controls the electrical state at the output nodes for both of the isolation circuits associated with the pair of circuit groups via the electrical connecting means.

In a further embodiment of the present invention, the electrically connecting means comprises an electrical path with no logical delay devices in the electrical path.

In yet a further embodiment of the present invention, the output stage in each circuit group comprises a power supply, and a resistor network connected between the power supply and the circuit node for the circuit group; wherein the output stage of the circuit group in each pair of circuit groups which is powered on, operates to control the electrical state on the output node for the isolation circuit in the given pair of circuit groups which is not powered, by whether or not it draws current through the resistor network of the output stage of the not-powered circuit group in the pair via the electrically connecting means.

In a yet further embodiment of the present invention, each of the isolation circuits comprises an emitter-follower transistor with its base connected to its respective circuit node and with its emitter terminal comprising the output node.

In a further embodiment of the present invention, the switching means comprises a shift register with an input line for reading a predetermined number pattern into the shift register, with the shift register including a plurality of stages, with each stage having a true line connected to the power control line for one circuit group of a given pair of circuit groups, and having a complement line connected to the power control line for the other circuit group in the given pair of circuit groups.

DETAILED DESCRIPTION OF THE PREFERRED EMBODIMENT

The redundancy scheme of the present invention is designed to absorb defects that would otherwise render a nonredundant circuit chip nonfunctional. In the scheme, a complex logic circuit is subdivided into a plurality of different circuit groups. Each of these different circuit groups is replicated to produce an essentially identical pair of circuit groups. The size of a particular circuit group is a design parameter and may vary from one circuit to thousands of circuits per group. An optimum circuit group size in order to achieve the maximum chip yield possible may be determined empirically or by taking into account such factors as defect density, circuit family, integration level, and various other parameters.

Figure 1:
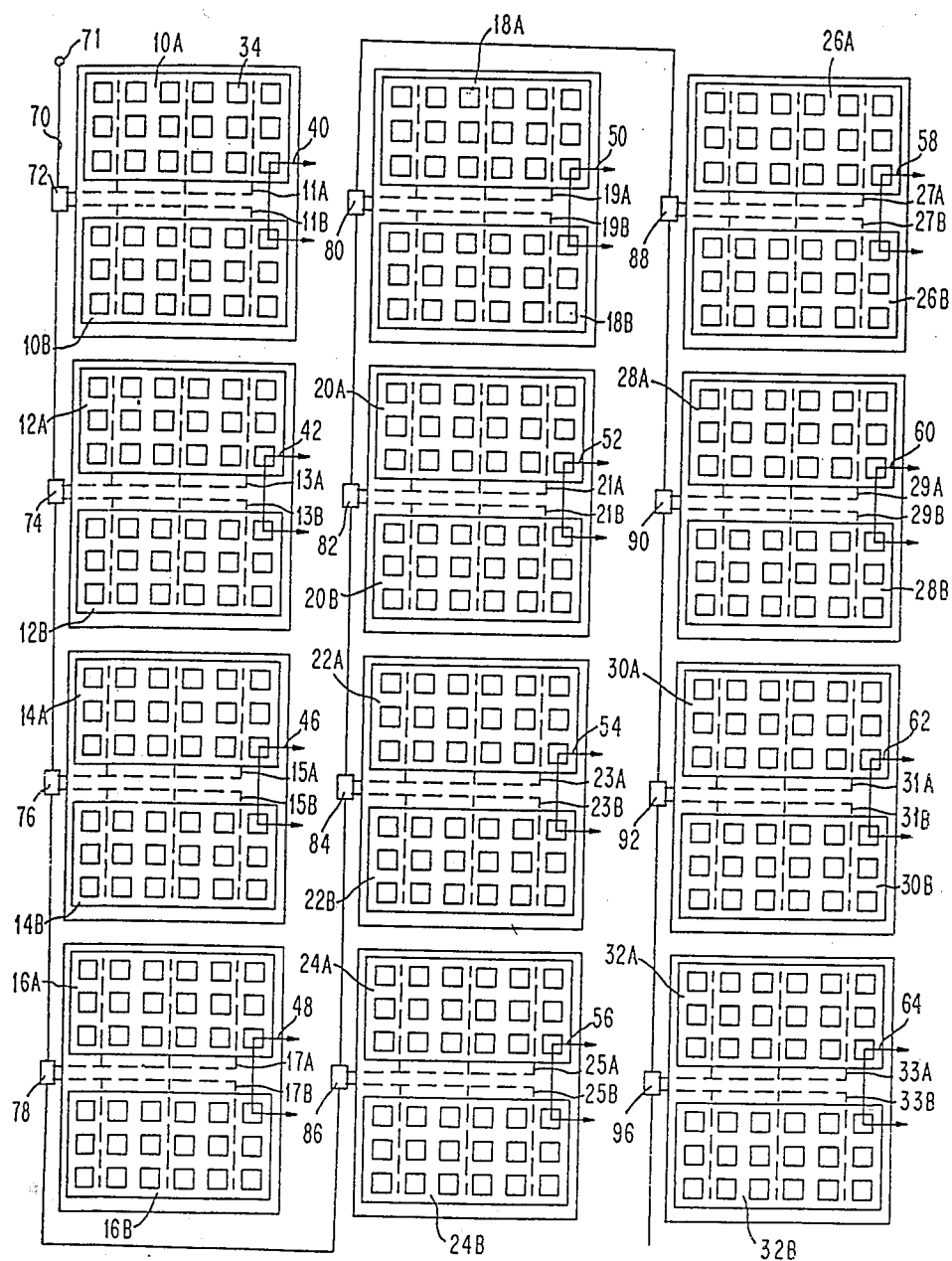
FIG. 1 is a schematic block diagram of one embodiment of the redundancy circuit scheme of the present invention.

Referring now to FIG. 1, a plurality of pairs of circuit groups, 10A, 10B through 32A, 32B, is shown. Each circuit group in a given pair has a respective circuit node and a respective power control line. In FIG. 1, the power control lines comprise 11A, 11B; 13A, 13B; 15A, 15B; 17A, 17B; 19A, 19B; 21A, 21B; 23A, 23B; 25A, 25B; 27A, 27B; 29A, 29B; 31A, 31B; and 33A 33B. Each circuit group in a given pair is designed for generating substantially the same electrical signal on its respective node as the other circuit group in its given pair generates on its respective circuit node. However, a given circuit group of a pair will operate if and only if its respective power control line is activated.

It should be noted that the circuit groups shown in FIG. 1 each comprise 18 individual circuits represented by the squares 34 shown therein. It is, of course, understood that these circuit groups may include any number of different circuits, and that the number of circuits in a given group may vary from circuit group pair to circuit group pair.

The redundancy scheme of FIG. 1 further includes means for electrically connecting together, for bidirectional communication, the circuit nodes for each pair of circuit groups, prior to the connection to an isolation circuit to be associated therewith (discussed below). In a preferred embodiment of the present invention, each of these electrically connecting means comprises simply a strap, or metal line which forms a bi-directional electrical communication path between the circuit nodes for the given pair. It is preferred that this electrically connecting means not include any form of logic or control elements therein which might add delay to the overall chip operation. Referring to the Figure, the electrical straps 40-64 are utilized to connect the circuit nodes for the pairs of circuit groups 10-32, respectively.

The redundancy scheme shown in FIG. 1 further includes switching means connected to each of the power control lines associated with the plurality of pairs of circuit groups for providing power to one and only one circuit group in each pair of circuit groups. There are a variety of means available for implementing such a switching means to control the power lines for the circuit groups. In one embodiment of the present invention, the switching means may comprise a shift register 70, with an input terminal 71 for reading a predetermined number pattern into the shift register. The shift register 70 includes a plurality of consecutive stages 72-96, with each stage having a true line connected to the power control line for one circuit group of a given pair of circuit groups, and having a complement line connected to the power control line for the other circuit group of the given pair of circuit groups. Accordingly, the switching means may be operated simply by reading a predetermined pattern into the stages of the shift register, so that one of either the true or the complement lines for each stage is energized to power the respective circuit group connected thereto.

The redundancy scheme of FIG. 1 further includes a plurality of isolation circuits having respective output nodes, with a different isolation circuit connected to the circuit node for each different circuit group, with the isolation circuits being powered at all times during operation, with each of the isolation circuits providing an output signal on its output node indicative of the signal on the circuit node connected thereto, while isolating the connected circuit node from nets connected to the isolation circuit output node.

Figure 2:
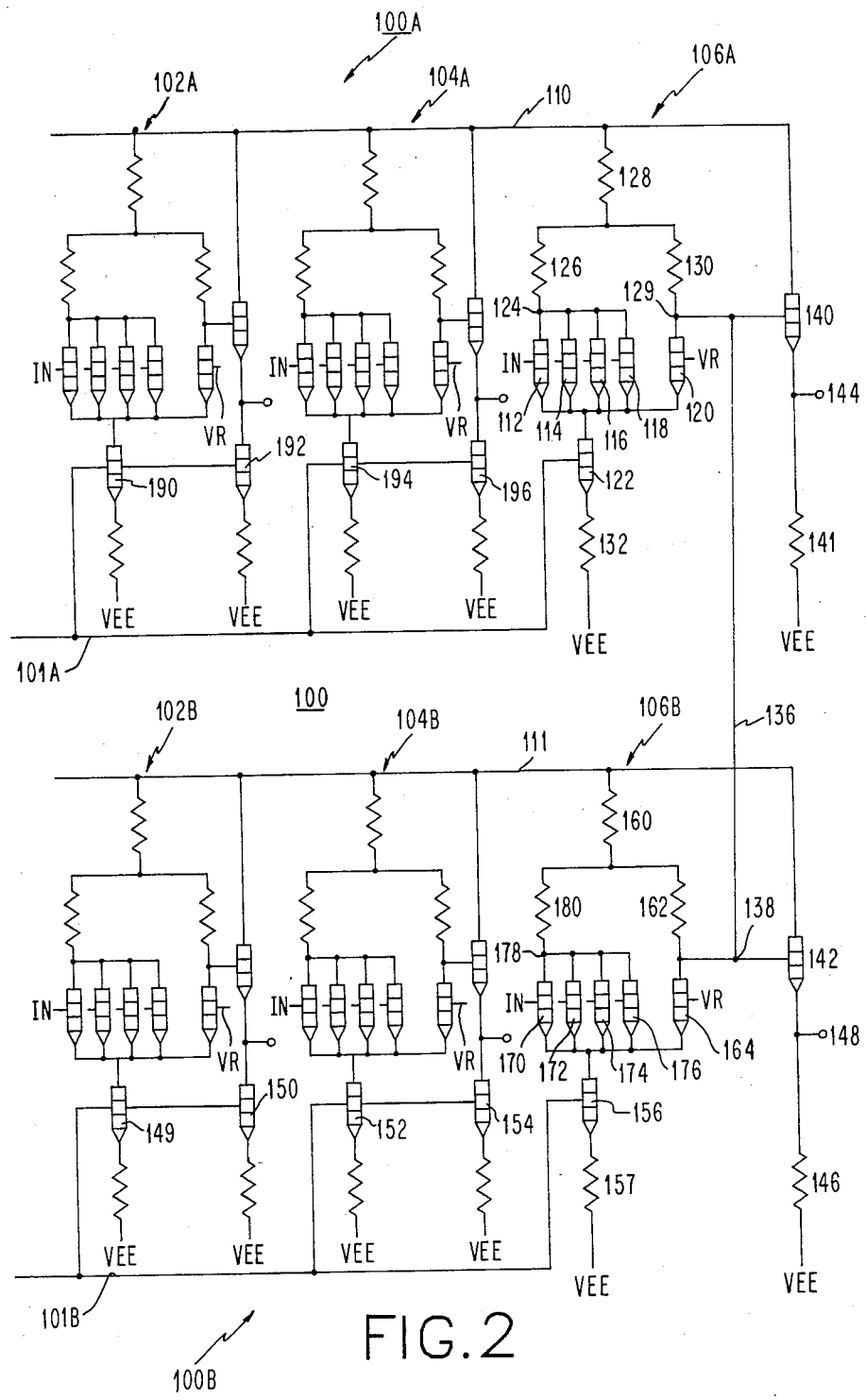
FIG. 2 is a schematic circuit diagram of one pair of circuit groups formed in accordance with the present invention.

The redundancy scheme further includes means for controlling, through the electrically connecting means, the electrical state at the isolation circuit output node of the circuit group in a given pair of circuit groups which is not powered by the switching means, to have the same electrical state as the isolation circuit output node of the circuit group in the given pair of logic groups which is powered by the switching means, so that both isolation circuit output nodes in the pair provide a correct electrical signal. There are a variety of different ways that the above described plurality of isolation circuits and the means for controlling the electrical state of the isolation circuit output nodes can be implemented. The present invention is not limited to any particular means or to the use of any particular type of switching element for effecting such an implementation. For purposes of explanation, one particular circuit implementation of the isolation circuits and the controlling means is shown in FIG. 2 in the context of an emitter-coupled logic circuit configuration. Again, it is noted that the present invention is not limited to this particular configuration or circuit type.

Referring now to FIG. 2, a very simple pair of circuit groups 100 is shown, comprising the circuit groups 100A and 100B. The circuit block 100A is shown to comprise, for ease of explanation, only logic circuits 102A, 104A, and 106A. Likewise, the circuit group 100B in the circuit group pair 100 comprises the circuits 102B, 104B, and 106B. In the example shown in FIG. 2, these circuits 102-106 simply comprise OR circuits. These OR circuits are identical, so that only the circuits 106A and 106B will be discussed.

Referring now to the circuit 106A, it includes a power line 110, a set of parallel connected input transistors 112, 114, 116, and 118, and a reference transistor 120. The emitters of the transistors 112-120 are connected to the collector of a power supply transistor 122. The collectors of the input transistors 112-118 are connected to a node 124. Node 124, in turn, is connected to the power supply line 110 through a pair of series connected resistors 126 and 128. The bases for the transistors 112-118 receive respective logic input signals. The collector of the reference transistor 120 is connected through a resistor 130 and the resistor 128 to the power supply line 110. The base of the reference transistor 120 is connected to a reference voltage, VR. The collector of the reference transistor 120 is also connected to a circuit node 129. Accordingly, this circuit node 129 is connected to the power supply line 110 through the series-connected resistors 130 and 128. The current supply transistor 122 in the circuit may have its emitter connected to a different power supply voltage VEE through a resistor 132. The base of the current supply transistor 122 is connected to a power control line 101A. In the embodiment shown in FIG. 1, this power control line may comprise either the true or complement output line for a stage in the shift register 70.

The circuit 106B includes a power supply line 111, a set of parallel input transistors 170, 172, 174, and 176, and a reference transistor 164. The emitters of transistors 170–176 and reference transistor 164 are connected to the collector of a current supply transistor 156. The collectors of the transistors 170–176 are connected to a node 178. Node 178 is connected, via the series connected resistors 180 and 160, to the power supply line 111. The bases of the transistors 170–176 receive input logic signals. The collector of the reference transistor 164 is connected to a circuit node 138. Circuit node 138 is connected to the power supply line 111 via a set of series connected resistors 162 and 160. The base of the reference transistor 164 is connected to a reference voltage, VR. The current supply transistor 156 has its emitter connected to the power supply source VEE through the resistor 157. The base of the current supply transistor 156 is connected to the power control line 101B. The power control line 101B comprises the other of the true or complement line from the shift register stage connected to the power control line 101A.

Note that in accordance with the present invention, the circuit node 129 for the circuit group 100A is connected by means of an electrically connecting means 136 to the circuit node 138 for the circuit group 100B. In the embodiment shown in FIG. 2, this electrically connecting means simply comprises a metal strap or line for forming a bi-directional electrical path.

In the embodiment shown in FIG. 2, the isolation circuit required with the present invention is implemented by an emitter follower transistor 140 for the circuit group 100A, and by an emitter follower transistor 142 for the circuit group 100B. In the configuration shown in FIG. 2, the collector for the emitter follower transistor 140 is connected directly to the power supply 110, while its emitter is connected to the second power supply voltage VEE through a resistor 141. The emitter of the emitter-follower transistor 140 is connected to an output node 144, which may be connected to an external net. The base of the emitter-follower transistor 140 is connected to the circuit node 129. Likewise, the emitter-follower transistor 142 has its collector connected to the power supply line 111, its emitter connected through a resistor 146 to the second power supply voltage VEE, and its base connected to the circuit node 138. Again, the emitter of the emitter-follower transistor 142 is connected to an output node 148, which may be connected to an external net.

It can be seen that each of the isolation circuits 140 and 142, with their respective collectors and emitters connected across power supply line 110 and the second power supply voltage VEE, and with their bases connected through a resistor network to the respective power supply lines 110 and 111, are powered on at all times during operation. It can be seen that any signal line shorts in the external circuit nets connected to the respective output nodes 144 and 148, cannot be propagated back through these isolation circuits to the respective circuit nodes 129 and 138. Accordingly, a signal line short on an external net connected to a given output node cannot propagate backward into the associated circuit group or be propagated across the electrical connecting means 136 to the other circuit group in the respective circuit group pair.

An additional important feature of the present invention is that means are provided for controlling, through the electrically connecting means, the electrical state at the isolation circuit output node of the circuit group in a given pair of circuit groups, which is not powered by the switching means, to have the same electrical state as the isolation circuit output node of the circuit group in the given pair of circuit groups which is powered by the switching means. With this feature, both output nodes 144 and 148 in FIG. 2 provide the same electrical logic or control state to external nets attached thereto. It should be noted that the use of the electrical connecting means 136 between the circuit nodes 129 and 138 does not inherently guarantee that the electrical states at the output nodes 144 and 148 are the same. In this regard, the circuitry for the output stage for a given circuit group must be designed so that when a circuit group is powered on, it controls the electrical state at the output nodes for both of the isolation circuits associated with the pair of circuit groups. In the embodiment shown in FIG. 2, this control is achieved by connecting the circuit nodes for the respective groups to the power supply lines 110 and 111 through respective resistor networks. Accordingly, the output stage of the circuit group in each pair of circuit groups which is powered operates to control the electrical state on the output node for the isolation circuit in the given pair of circuit groups which is not powered, by whether or not it draws current through the resistor network of the output stage of the not-powered circuit group in the pair via the electrically connecting means 136.

In order to understand the foregoing control feature of the present invention, the operation of the circuit of FIG. 2 will be discussed for the example where the circuit group 100B is not powered and the circuit group 100A is powered. In this case, the control line 101B has a low voltage so that respective current supply transistors 149, 150, 152, 154, and 156 for circuit group 100B are all biased into non-conduction, while the control line 101A is at a high voltage so that its respective current supply transistors 190, 192, 194, 196 and 122 are conducting. Accordingly, no power is drawn by the circuit group 101B. However, note that the isolation circuit transistor 142 is always powered on due to the connection of its base to the power supply line 111 through the resistor network (160 and 162) and the connection of its collector to power supply line 111 and the connection of its emitter to the second power supply VEE.

In accordance with this feature of the present invention, the output node 148 is to be controlled by the electrical state of the circuit node 129 in the powered circuit group 100A. That this occurs in the circuit of FIG. 2 can be seen from the following discussion. For the case where the reference transistor 120 is conducting (all of the input signals to the input transistors 112, 114, 116, and 118 are low) the transistor 120 is drawing current from the power supply line 110 through the resistors 128 and 130, and sinking that current into the current supply transistor 122 to the second power supply VEE. The voltage drop provided by the resistor 130 causes the voltage at the circuit node 129 to be in a LOW state. The emitter-follower transistor 140 then translates this LOW voltage state by one $V_{be}$ voltage drop and provides this translated LOW voltage to the output node 144. Additionally, the reference transistor 120 draws current from the voltage supply line 111 through the series-connected resistors 160 and 162 connected to the circuit node 138, through the electrical connecting line 136 which is connected to the circuit node 129, through the reference transistor 120, through the current supply transistor 122, to the second power supply voltage VEE. Accordingly, the voltage drop across the resistor 162 causes the voltage at the circuit node 138 to be in a LOW voltage state. This LOW voltage state is translated by the emitter-follower transistor 142 by one $V_{be}$ voltage drop to the output node 148.

When one of the input signals connected to the bases of the input transistors 112, 114, 116, or 118 is at a HIGH level, then current is drawn by that transistor from the power supply line 110 through the resistors 128 and 126, and is sunk through the current supply transistor 122 to the second power supply voltage VEE. In this case, only a very small current (on the order of micro amperes) sufficient to maintain the emitter-follower transistor 140 in conduction, is drawn through the resistor 130, resulting in a very small voltage drop thereacross. Accordingly, the voltage at the circuit node 129 rises to a HIGH voltage level. This voltage level is again translated by the emitter-follower transistor 140 to the output node 144. Since the reference transistor 120 is not conducting, no current is drawn from the power supply line 111 through the resistors 160 and 162 and the circuit node 138 via the electrically line 136. Accordingly, only the very small current necessary to maintain the emitter-follower transistor 142 in conduction is drawn through the resistor 162. Thus, the voltage of the circuit node 138 is HIGH. This circuit node 138 voltage is translated by the $V_{be}$ voltage drop of the emitter-follower transistor 142 and is applied to the output node 148. Thus, it can be seen for the case of the circuit group 100A being powered on, that the voltage at the circuit nodes 129 and 138 is determined by whether or not the reference transistor 120 draws current. An identical operation would occur if the circuit group 100B was powered on and the circuit group 100A was powered off. In that case, the voltage level at the circuit nodes 129 and 138 would be determined by whether or not the voltage reference transistor 164 draws current therethrough.

It can be seen from the above description that the key circuit features are the combination of the isolation circuits 140 and 142 and the electrically connecting means 136, in conjunction with the specially designed circuity for the output stages 106A and 106B, to permit whichever of the output stages is powered on to control the electrical state at the output nodes for both of the isolation circuits 140 and 142. In the particular example in FIG. 2, this special output stage design takes the form of a resistor network connected between the power supply and the circuit node for the given circuit group, with the output stage configured, when powered, to draw current through the resistor networks of both the powered and unpowered output stages for the pair of circuit groups, to thereby control the electrical state on the output nodes for the isolation circuits for both circuit groups in the circuit group pair. This design thus ensures that the output nodes for the isolation circuits for a given circuit pair have the same electrical state.

It should be noted that at any given moment, the present circuit design is not redundant, because the duplicate circuit in the circuit group pair is powered off. Accordingly, there is little additional power loss due to this redundancy configuration. In addition, this power down for the redundant circuit prevents the propagation of any faulty signals.

It should also be noted that the present configuration produces two functionally correct output signals at the output nodes for the isolation circuits, even in the presence of a fault in one of the circuit groups. These two functionally correct output signals are achieved through the use of the electrical strap in combination with the specially designed output stages for the circuit groups. However, the use of the electrical strap causes the external nets connected to one output node in a circuit group to lose its independence from the external net connected to the other output node for the other circuit group in the pair. The loss of independence caused by this design would permit a short in one of the external nets connected to an output node to cause an undesired logical signal to appear on both external nets for the circuit group pair. Accordingly, such a short to one of the output nets would destroy the functionality of the chip. The isolation circuits are thus an essential feature that must be used in combination with the electrical strap and the specially designed output stages in order to prevent faulty logical states due to signal shorts in one external net connected to one circuit group in a pair from propagating back through the electrical strap to the other external net connected to the other circuit group in the pair.

It should be noted that the switching means may be implemented by any of a variety of storage device or memory cell configurations which are either independent of each other, or connected. In the example shown in FIG. 1, the switching means comprises a series of latches. In a preferred embodiment, the latches are connected to form a shift register which may be loaded in a sequential manner.

The present invention effectively absorbs defects that would otherwise render a nonredundant integrated circuit chip nonfunctional. It substantially enhances the yield of random logic chips whose size would not be manufacturable without redundancy. In this regard, it has been found that redundancy using the present configuration permits construction of chips, at comparable yield, with six to ten times the functional circuitry as compared to nonredundant chips. Additionally, the use of redundancy in accordance with the present scheme will enable a given manufacturing line to deliver in the same time period, ten to fifteen times the volume of shippable circuits then without redundancy.

It should be noted that the redundancy scheme of the present invention is especially amenable to the use of simple methods of convergence in logic circuit design.

While the present invention has been particularly shown and described with reference to preferred embodiments therefore, it will be understood by those skilled in the art that the foregoing and other changes in form and detail may be made therein without departing from the spirit and scope of the present invention.

We claim:
1. A redundancy circuit scheme, comprising:
a plurality of pairs of circuit groups, each circuit group having a respective circuit node and a respective power control line; said each circuit group in a given pair for generating substantially the same electrical signal on its respective circuit node as the other circuit group in the given pair generates on its respective circuit node;

a plurality of isolation circuits having respective output nodes, with a different isolation circuit connected to the circuit node for each different circuit group, said isolation circuits being powered at all times during operation, each of said isolation circuits for providing an output signal on its output node indicative of the signal on the circuit node connected thereto, while isolating said connected circuit node from nets connected to said isolation circuit output node;

means for electrically connecting together, for bidirectional communication, the circuit nodes for each pair of circuit groups, prior to the connection to the isolation circuits associated therewith;

switching means connected to each of said power control lines associated with said plurality of pairs of circuit groups for providing power to one and only one circuit group in each pair of circuit groups; and means for controlling, through said electrically connecting means, the electrical state at the isolation circuit output node of the circuit group in a given pair of circuit groups which is not powered by said switching means to have the same electrical state as the isolation circuit output node of the circuit group in the given pair of circuit groups which is powered by said switching means, so that both isolation circuit output nodes in said pair provide a correct electrical signal.

2. A redundancy circuit as defined in claim 1, wherein said controlling means comprises, for each pair of circuit groups, an output stage in each circuit group which, when its circuit group is powered on, controls the electrical state at the output nodes for both of the isolation circuits associated with said pair of circuit groups via said electrically connecting means.

3. A redundancy circuit as defined in claim 2, wherein said electrically connecting means comprises an electrical path with no logical delay devices in said electrical path.

4. A redundancy circuit as defined in claim 3, wherein the output stage in each circuit group comprises:

a power supply;

a resistor network connected between said power supply and the circuit node for the circuit group; and wherein the output stage of the circuit group which is powered in each pair of circuit groups operates to control the electrical state on its own output node and on the output node for the isolation circuit in the given pair of circuit groups which is not powered, by whether or not it draws current through the resistor network of the output stage of the not-powered circuit group in the pair via said electrically connecting means.

5. A redundancy circuit as defined in claim 4, wherein said switching means comprises a shift register with an input line for reading a predetermined number pattern into said shift register, said shift register including a plurality of stages, with each stage having a true line connected to the power control line for one circuit group of a given pair of circuit groups and having a complement line connected to the power control line for the other circuit group of said given pair of circuit groups.

6. A redundancy circuit as defined in claim 5, wherein the circuits in a given circuit group are sourced by at least one current sink, said at least one current sink being connected to said power control line for its respective circuit group and operating to sink current only when said power control line is activated.

7. A redundancy circuit as defined in claim 6, wherein each of said isolation circuits comprises an emitter-follower transistor with its base connected to its respective circuit node and with its emitter terminal comprising the output node.

8. A redundancy circuit as defined in claim 7, wherein each of said emitter-follower transistors has its collector terminal connected directly to said power supply, and its base connected to said power supply through said resistor network of said output stage.

9. A logic redundancy circuit as defined in claim 8, wherein said logic circuit groups are formed from emitter-coupled circuits.

10. A logic redundancy circuit as defined in claim 1, said electrically connecting means comprises an electrical path with no logical delay devices in said electrical path.

11. A logic redundancy scheme as defined in claim 10, wherein each of said isolation circuits comprises an emitter-follower transistor with its base connected to its respective circuit node and with its emitter terminal comprising the output node.

12. A logic redundancy scheme as defined in claim 1, wherein said switching means comprises a shift register with an input line for reading a predetermined number pattern into said shift register, said shift register including a plurality of stages, with each stage having a true line connected to the power control line for one circuit group of a given pair of circuit groups and having a complement line connected to the power control line for the other circuit group of said given pair of circuit groups.

13. A single semiconductor chip, comprising:

a first plurality of logic circuits formed in said chip;

a plurality of line fanouts;

means for partitioning a second plurality from said first plurality of said logic circuits on said chip into redundant pairs of circuit blocks, wherein each circuit block performs a logic function identical to the logic function performed by the other circuit block in said pair, with each circuit block generating a logic output signal on a logic node associated therewith, each circuit block in a pair including first power source means for powering, only upon actuation by an associated control line, the majority of said logic circuits in said circuit block to generate said logic signal on said logic node;

second power source means;

isolation means connected to said logic node and connected to and powered at all times by said second power source means for providing a signal indicative of the logic signal on said logic node to a selected line fanout, while isolating said line fanout from said logic circuits in said circuit block;

an electrical path with no logical delay devices therein for providing for bidirectional electrical communication between the logic nodes for each pair of circuit blocks prior to their connection to their respective isolation means; and switching means connected to each of said control lines, said switching means for providing power to one and only one of said first power source means in each of said pairs of circuit blocks.

14. A semiconductor chip as defined in claim 13, wherein each circuit block includes an output stage which, when that circuit block is powered on, controls the logic state at the output nodes for both of the isolation means associated with said pair of logic circuit blocks via said electrical path.

15. A semiconductor ohip as defined in claim 14, wherein the output stage in each circuit block comprises:
a power supply;
a resistor network connected between said power supply and the logic node for the block; and
wherein the output stage of the circuit block in each pair of circuit blocks which is powered operates to control the logic state on the output node for the isolation means in the given pair of circuit blocks which is not powered by whether or not it draws current through the resistor network of the output stage of the not powered circuit block in the pair via said electrical path.

16. A semiconductor chip as defined in claim 15 wherein said switching means comprises a shift register with an input line for reading a predetermined number pattern into said shift register, said shift register including a plurality of stages, with each stage having a true line connected to the power control line for one circuit block of a given pair of circuit blocks, and having a complement line connected to the power control line for the other circuit block of said given pair of circuit blocks.

17. A semiconductor chip as defined in claim 16, wherein said isolation means comprises an emitter-follower transistor with its base connected to its respective logic node and with its emitter terminal comprising the output node.

* * * * *